(12) United States Patent
Bhalla et al.

(10) Patent No.: US 8,164,199 B2
(45) Date of Patent: Apr. 24, 2012

(54) MULTI-DIE PACKAGE

(75) Inventors: Anup Bhalla, Santa Clara, CA (US); Yi Su, Sunnyvale, CA (US); David Grey, Santa Clara, CA (US)

(73) Assignee: Alpha and Omega Semiconductor Incorporation, Sunnyvale, CA (US)

( * ) Notice: Subject to any disclaimer, the term of this patent is extended or adjusted under 35 U.S.C. 154(b) by 267 days.

(21) Appl. No.: 12/534,057

(22) Filed: Jul. 31, 2009

(65) Prior Publication Data

US 2011/0024917 A1  Feb. 3, 2011

(51) Int. Cl.
*H01L 23/495* (2006.01)
*H01L 23/02* (2006.01)
*H01L 29/40* (2006.01)

(52) U.S. Cl. .................. 257/777; 257/666; 257/686

(58) Field of Classification Search .................. 257/666, 257/786, 777
See application file for complete search history.

(56) References Cited

U.S. PATENT DOCUMENTS

| | | | |
|---|---|---|---|
| 5,495,398 A | 2/1996 | Takiar et al. | |
| 5,557,842 A | 9/1996 | Bailey | |
| 5,814,884 A | 9/1998 | Davis et al. | |
| 5,917,241 A | 6/1999 | Nakayama et al. | |
| 6,031,279 A | 2/2000 | Lenz | |
| 6,055,148 A | 4/2000 | Grover | |
| 6,184,585 B1 | 2/2001 | Martinez et al. | |
| 6,249,041 B1 | 6/2001 | Kasem et al. | |
| 6,265,763 B1 | 7/2001 | Jao et al. | |
| 6,414,387 B1 | 7/2002 | Hara et al. | |
| 6,424,035 B1 | 7/2002 | Sapp et al. | |
| 6,593,622 B2 | 7/2003 | Kinzer et al. | |
| 6,677,669 B2 | 1/2004 | Standing | |
| 6,777,800 B2 | 8/2004 | Madrid et al. | |
| 6,841,852 B2 | 1/2005 | Luo et al. | |
| 6,858,922 B2 | 2/2005 | Pavier | |
| 6,864,588 B2 | 3/2005 | Hung | |
| 6,933,593 B2 | 8/2005 | Fissore et al. | |
| 7,030,501 B2 | 4/2006 | Yoshiba et al. | |

(Continued)

FOREIGN PATENT DOCUMENTS

KR  10-0826989  11/2004
KR  10-2004-92304  5/2008

OTHER PUBLICATIONS

Office Action dated Nov. 24, 2009 for U.S. Appl. No. 11/944,313.

(Continued)

*Primary Examiner* — James Mitchell
(74) *Attorney, Agent, or Firm* — James Cai; Schein & Cai LLP

(57) ABSTRACT

A multi-die package has a plurality of leads and first and second semiconductor dies in superimposition and bonded together defining a die stack. The die stack has opposed first and second sides, with each of the first and second semiconductor dies having gate, drain and source regions, and gate, drain and source contacts. The first opposed side has the drain contact of the second semiconductor die, which is in electrical communication with a first set of the plurality of leads. The gate, drain and source contacts of the first semiconductor die and the gate and source contacts of the second semiconductor die are disposed on the second of said opposed sides and in electrical communication with a second set of the plurality of leads. The lead for the source of the first semiconductor die may be the same as the lead for the drain of the second semiconductor die.

17 Claims, 5 Drawing Sheets

U.S. PATENT DOCUMENTS

| | | | |
|---|---|---|---|
| 7,057,273 | B2 | 6/2006 | Harnden et al. |
| 7,088,074 | B2 | 8/2006 | Clevenger et al. |
| 7,115,985 | B2 | 10/2006 | Antol et al. |
| 7,166,496 | B1 | 1/2007 | Lopez et al. |
| 7,166,919 | B2 | 1/2007 | Tabira |
| 7,183,616 | B2 | 2/2007 | Bhalla et al. |
| 7,215,012 | B2 | 5/2007 | Harnden et al. |
| 7,291,869 | B2 * | 11/2007 | Otremba ................ 257/107 |
| 7,301,235 | B2 | 11/2007 | Schaffer et al. |
| 7,508,012 | B2 | 3/2009 | Otremba |
| 7,511,361 | B2 | 3/2009 | Zhang et al. |
| 7,514,778 | B2 | 4/2009 | Otremba et al. |
| 7,612,439 | B2 | 11/2009 | Zhang et al. |
| 7,755,179 | B2 * | 7/2010 | Carney et al. ............. 257/686 |
| 7,800,217 | B2 * | 9/2010 | Otremba et al. .......... 257/700 |
| 7,884,454 | B2 | 2/2011 | Lu et al. |
| 7,898,080 | B2 * | 3/2011 | Otremba ................ 257/732 |
| 2001/0019490 | A1 | 9/2001 | Igarashi et al. |
| 2002/0093094 | A1 | 7/2002 | Takagawa et al. |
| 2002/0163040 | A1 | 11/2002 | Kinzer et al. |
| 2004/0004272 | A1 | 1/2004 | Luo et al. |
| 2004/0227547 | A1 | 11/2004 | Shiraishi et al. |
| 2004/0251529 | A1 | 12/2004 | Lee et al. |
| 2005/0017339 | A1 | 1/2005 | Yoshiba et al. |
| 2005/0082679 | A1 | 4/2005 | Otremba |
| 2005/0133902 | A1 | 6/2005 | Pavier et al. |
| 2005/0145996 | A1 | 7/2005 | Luo et al. |
| 2005/0145998 | A1 | 7/2005 | Harnden et al. |
| 2006/0055009 | A1 * | 3/2006 | Shim et al. ............. 257/666 |
| 2006/0118815 | A1 | 6/2006 | Otremba et al. |
| 2006/0145312 | A1 | 7/2006 | Liu |
| 2006/0145318 | A1 | 7/2006 | Zhang et al. |
| 2007/0007640 | A1 | 1/2007 | Harnden et al. |
| 2007/0080443 | A1 | 4/2007 | Sun et al. |
| 2007/0085187 | A1 | 4/2007 | Sun et al. |
| 2007/0145609 | A1 | 6/2007 | Zhang et al. |
| 2007/0215996 | A1 | 9/2007 | Otremba |
| 2008/0111219 | A1 | 5/2008 | Harnden et al. |
| 2008/0185695 | A1 * | 8/2008 | Kim et al. ............... 257/670 |
| 2008/0207094 | A1 | 8/2008 | Feng et al. |
| 2008/0224323 | A1 | 9/2008 | Otremba |
| 2008/0242052 | A1 | 10/2008 | Feng et al. |
| 2008/0296782 | A1 | 12/2008 | Otremba et al. |
| 2009/0008758 | A1 | 1/2009 | Lu et al. |
| 2009/0020854 | A1 | 1/2009 | Feng et al. |
| 2009/0128968 | A1 | 5/2009 | Lu et al. |
| 2009/0179265 | A1 | 7/2009 | Harnden et al. |
| 2009/0189281 | A1 | 7/2009 | Han |
| 2009/0258458 | A1 | 10/2009 | Zhang et al. |
| 2010/0013106 | A1 * | 1/2010 | Otremba et al. .......... 257/777 |

OTHER PUBLICATIONS

Ex Parter Quayle Action dated Nov. 25, 2008 for U.S. Appl. No. 11/316,614.
Notice of Allowance and Fee(s) Due dated Jun. 25, 2009 for U.S. Appl. No. 11/316,614.
Office Action dated May 16, 2007 for U.S. Appl. No. 11/150,489.
Notice of Allowance and Fee(s) Due dated Nov. 17, 2008 for U.S. Appl. No. 11/150,489.
Final Office Action dated Feb. 25, 2008 for U.S. Appl. No. 11/150,489.
Final Office Action dated Feb. 23, 2010 for U.S. Appl. No. 11/029,653.
International Search Report and Written Opinion of International Application No. PCT/US06100356, mailing date Jul. 19, 2006.
Notification concerning availability of the publication of the International Applicaion of PCT/US06/00356, mailing date Nov. 9, 2006.
Notification concerning transmittal of international preliminary reprot for PCT/US06/00356, mailing date Jul. 19, 2007.
International Search Report and Written Opinion of International Application No. PCT/US2006/022909 mailing date Feb. 28, 2008.
Notification Concerning Transmittal of international Preliminary Report on Patentability for PCT/US2006/022909, Mailing date Mar. 19, 2009.
Office Action dated Aug. 18, 2009 for U.S. Appl. No. 11/029,653.
U.S. Appl. No. 12/384,100, filed Mar. 30, 2009, entitled DFN Semiconductor Package Having Reduced Electrical Resistence and identifying Xiaotian Zhang et al. as inventors.
Notice of Rejection dated Nov. 16, 2010 issued for Korean patent application No. 10-2009-0019811.
Notice of Allowance and Fee(s) Due dated Sep. 17, 2008 for U.S. Appl. No. 11/029,653.
Office Action dated Mar. 20, 2008 for U.S. Appl. No. 11/029,653.
General definition of Dual Flat No lead by www.answers.com search word: Dual flat no lead.
Advisory Action dated Nov. 27, 2007 for U.S. Appl. No. 11/029,653.
Final Office Action dated Aug. 6, 2007 for U.S. Appl. No. 11/029,653.
Office Action dated Nov. 28, 2006 for U.S. Appl. No. 11/029,653.
Office Action dated Feb. 22, 2006 issued for U.S. Appl. No. 11/029,653.
Office Action dated Apr. 14, 2010 issued for U.S. Appl. No. 11/944,313.
Office Action dated Jul. 28, 2008 issued for U.S. Appl. No. 11/150,489.
Notice of Allowance and Fees Due dated Jun. 23, 2008 issued for U.S. Appl. No. 11/316,614.
Office Action dated Feb. 6, 2008 issued for U.S. Appl. No. 11/316,614.
International Search Report and Written Opinion of the International Searching Authority dated Apr. 6, 2009 for the International Patent Application No. PCT/US2008/074924, 11 pages.
Notice of Allowance and Fees Due dated Oct. 1, 2010 issued for U.S. Appl. No. 11/944,313.

* cited by examiner

MULTI-DIE PACKAGE

BACKGROUND OF THE INVENTION

The present invention generally relates to semiconductor packages and more particularly to semiconductor packages and methods of making semiconductor packages.

In many MOSFET switching circuits a pair of power MOSFETs is switched in complementary fashion. A typical MOSFET switching circuit 10 is shown in FIG. 1 and includes two MOSFETs 12 and 14 coupled in series across a voltage source $V_{in}$ and ground. MOSFETs 12 and 14 are typically referred to as high side and low side MOSFETs, respectively.

To initiate a switching cycle, MOSFET 14 is first turned off. As a result, the body diode of MOSFET 14 turns-on and drives current. After a delay, MOSFET 12 turns on, turning-off the body diode of MOSFET 14. This generates a recovery current $I_L$ through, as well as, trace inductances (not shown) associated with switching circuit 10, producing oscillations.

In order to save space and cost, MOSFETs 12 and 14 are often co-packaged together, as indicated by a dashed line. It is the goal of MOSFETs 12 and 14 to attain the highest power density possible in order to work efficiently. The power density is closely related to the die area, i.e., the larger the die, the lower the drain-to-source on resistance, Rdson. Typically, MOSFETs 12 and 14 are co-packaged side by side, on separate die pads, as shown in FIG. 2. The overall package outline is indicated by the dashed line. Conventional power MOSFETs 12 and 14 are vertical devices, with the source S1 and S2, respectively, and gate, G1 and G2, respectively, on one side, and the drain, D1 and D2, respectively, on an opposing side. MOSFET 12 is attached to a die pad 16, which has leads extending from it allowing connection to drain D1. MOSFET 14 is attached to a die pad 18. The low side die pad can be exposed through the bottom of a dual flat non-leaded (DFN) package for external connection to drain D2 and source S1. Typically low side MOSFET 14 has a larger die area, compared to high side MOSFET 12, because MOSFET 14 is usually turned on for a longer duration of time. Source S1 contacts drain D2 by way of bond wires from S1 to die pad 18. Gates G1 and G2, as well as source are connected to the appropriate leads by bond wires. The die areas of MOSFETs 12 and 14 are constrained by the package size and by the side by side configuration of the dies.

Therefore, a need exists to improve the operational performance by maximizing the die area of MOSFETs to minimize Rdson without unduly increasing the overall size of the circuit.

SUMMARY OF THE INVENTION

In accordance with one aspect of the invention, a multi-die package has a plurality of leads and comprises first and second semiconductor dies in superimposition and bonded together defining a die stack. The die stack has opposed first and second sides, with each of the first and second semiconductor dies having gate, drain and source regions, and gate, drain and source contacts. The first opposed side has the drain contact of the second semiconductor die, which is in electrical communication with a first set of the plurality of leads. The gate, drain and source contacts of the first semiconductor die and the gate and source contacts of the second semiconductor die are disposed on the second of the opposed sides so as to be present in different planes, and in electrical communication with a second set of the plurality of leads. With this configuration, the die area of first and second semiconductor dies may be maximized without unduly increasing the overall size of the circuit. In accordance with another embodiment of the present invention, a floating metal layer may be disposed upon one of the first and second semiconductor dies to function as both a die pad and a bonding pad for the remaining semiconductor die of the first and second semiconductor dies. These and other aspects of the invention are discussed more fully below.

DETAILED DESCRIPTION OF THE INVENTION

Figure 1:
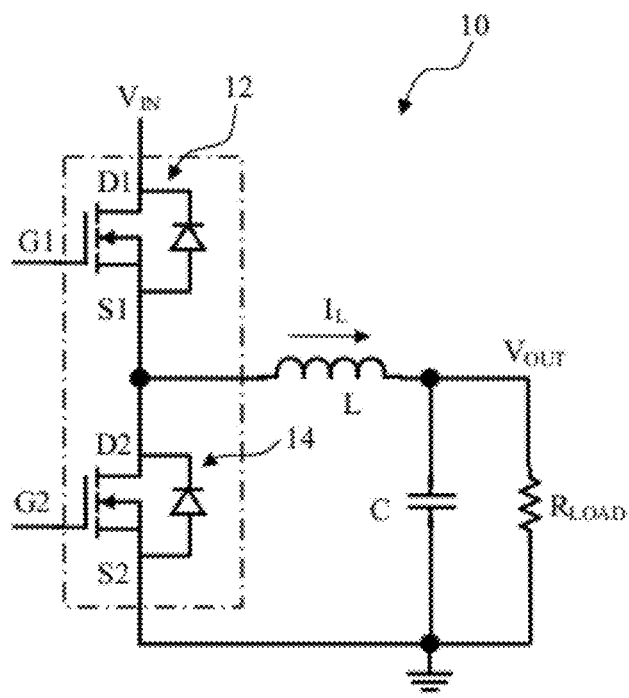
FIG. 1 is a schematic diagram of a MOSFET switching circuit in accordance with the prior art.
Figure 2:
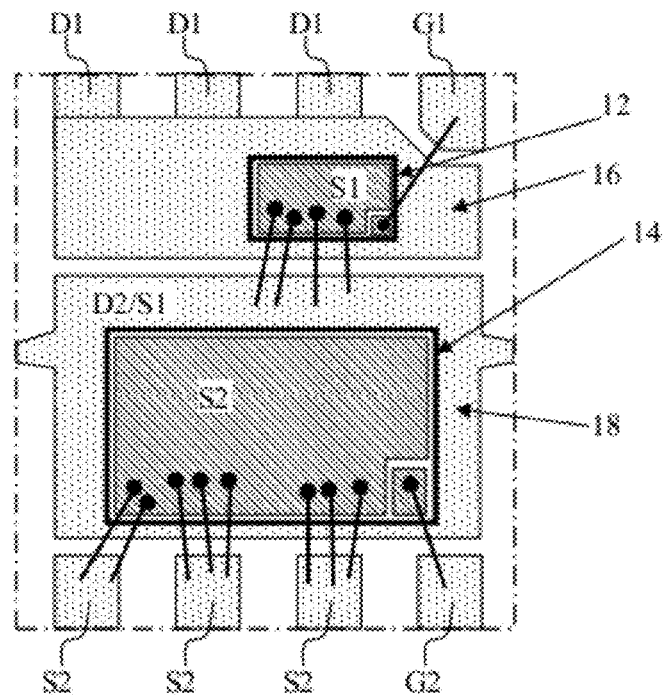
FIG. 2 is a top down plan view of a multi-chip package in accordance with the prior art.
Figure 3:
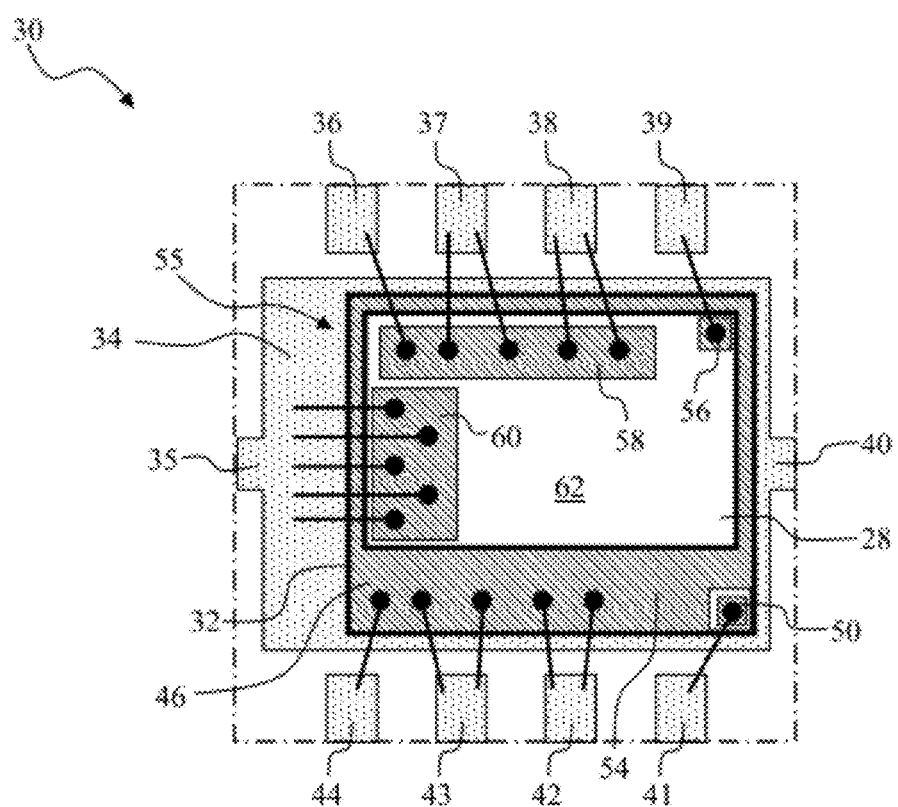
FIG. 3 is a top down plan view of a multi-chip package in accordance with one embodiment of the present invention.

Referring to both FIGS. 1 and 3, one embodiment of the present invention includes a multi-die package 30 in which MOSFET switching circuit 10 is provided. To that end, a first 28 and second 32 semiconductor dies are included. The outline of the semiconductor package 30 is indicated by the dashed line. Second semiconductor die 32 is attached to a die bonding pad 34 of a housing (not shown) that includes a plurality of tie bars 35 and 40, as well as leads 36-39 and 41-44. Semiconductor die 32 includes a MOSFET having gate, drain and source regions (not shown), each of which includes a contact, defining a gate contact 50, a drain contact (on its bottom surface, not shown), and a source contact 46. Drain contact is disposed upon a surface (not shown) of semiconductor die 32 that is positioned opposite to a surface 54 upon which gate contact 50 and source contact 46 are positioned. Electrical connection to the drain of semiconductor die 32 is achieved through bonding pad 34. In this package type, the bonding pad 34 may act as a lead itself, though one exposed at the bottom of the package. To that end, conductive adhesive (not shown), e.g., solder, conductive epoxy, eutectic metals, etc., is used to fixedly position semiconductor die 32 to bonding pad 34. Source contact 46 is placed in electrical communication with leads 42-44 with any known electrical connection technique including clips, plates, ribbons and the like. In the present example, wire bonds are employed, which may be aluminum, gold, copper and the like. Gate contact 50 is in electrical communication with lead 41 with a wire bond. Alternatively, instead of wire bonds, other suitable interconnections may be used, such as clips, plates, or conductive ribbons.

First semiconductor die 28 is in superimposition with second semiconductor die 32 and bonded thereto using non-conductive attachment substance (not shown), e.g., non-conductive epoxy, forming a die stack 55. First semiconductor die 28 includes a MOSFET having gate, drain and source regions (not shown), each of which includes a contact, defining a gate contact 56, a drain contact 58, and a source contact 60. Gate contact 56, drain contact 58, and source contact 60 are disposed upon a common surface 62 of first semiconductor die 28 that faces away from second semiconductor die 32. The region of second semiconductor die 32 upon which first semiconductor die 28 is bonded is spaced-apart from both gate contact 50 and the bonding area of source contact 46 to facilitate placement of bonding wires thereto. To that end, a die area of second semiconductor die 32 is greater than a die area of first semiconductor die 28. Source contact 60 is in electrical communication with drain contact (not shown) of the second semiconductor die 32 by bonding wires extending between bonding pad 34 and source contact 60. Drain contact 58 is in electrical communication with leads 36-38 and gate contact 56 is in electrical communication with lead 39, using bonding wires. By placing first 28 and second 32 semiconductor dies in superimposition, the die areas can be maximized.

Semiconductor dies 28 and 32 may include a variety of MOSFETs, such as both N-channel, both P-channel, or of complementary polarity. The MOSFET die parameters may be identical or asymmetrical in nature and optimized for high and low side switching. Second semiconductor die 32 may further include an integrated Schottky rectifier for further performance enhancement. Die stack 55 may be encapsulated in various plastic molds (not shown) and used with various lead frames to form conventional packages including the D-PAK, D2-Pak, multi lead TO-220, DFN or any other package design. The stacked die configuration clearly allows for larger die areas to be attained within the same semiconductor package size which leads to lower Rdson. Lower Rdson can be achieved for the same package footprint area. Alternatively a smaller package can be used while still achieving the same or better Rdson.

Figure 4:
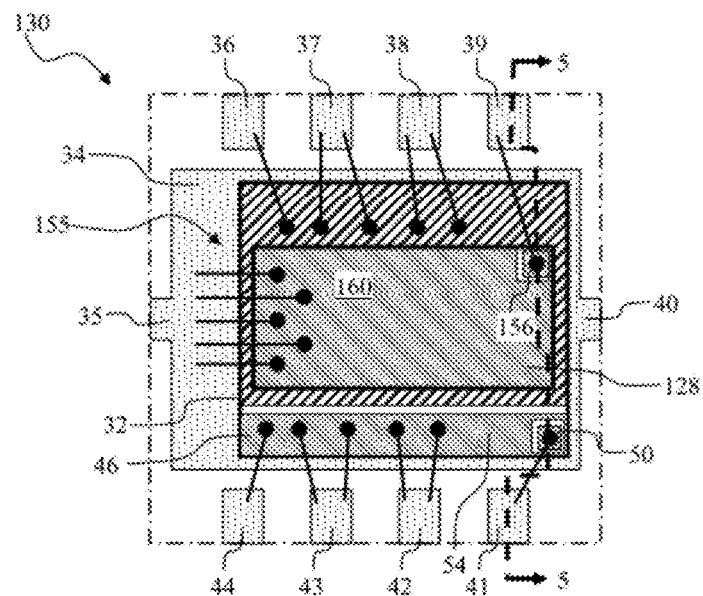
FIG. 4 is a top down plan view of a multi-chip package in accordance with a second embodiment of the present invention.
Figure 5:
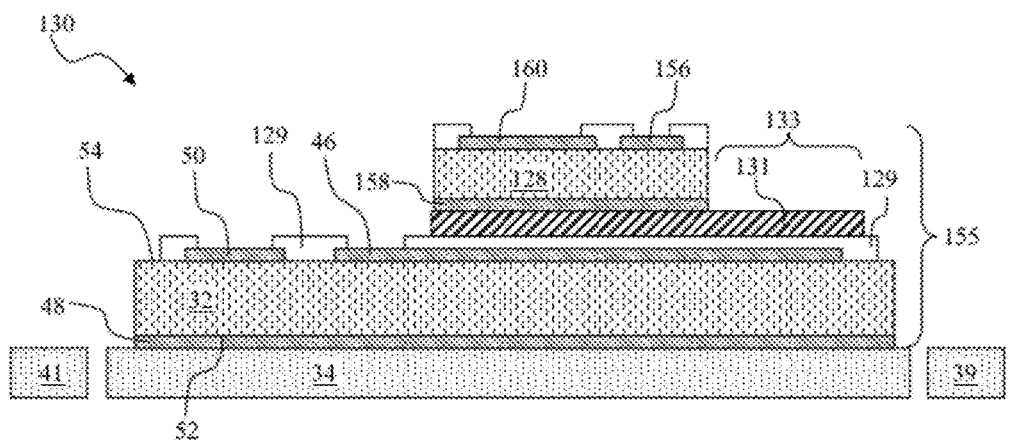
FIG. 5 is a cross-sectional view of the multi-chip package in FIG. 4 take along lines 5-5.

Referring to both FIGS. 4 and 5, in an alternate embodiment, multi-die package 130 includes a first 128 and second 32 semiconductor dies. Second semiconductor die 32 is attached to a die bonding pad 34, as discussed above. Specifically, conductive adhesive (not shown) is used to fixedly position second semiconductor die 32 to bonding pad 34 of a housing (not shown) that includes a plurality of leads 35-44. Semiconductor die 32 includes a MOSFET having gate, drain and source regions (not shown), each of which includes a contact, defining a gate contact 50, a drain contact 48, and a source contact 46. Drain contact 48 is disposed upon a surface 52 of semiconductor die 32 that is positioned opposite to a surface 54 upon which gate contact 50 and source contact 46 are positioned. Electrical communication between leads 35 and 40 and drain 48 is achieved through bonding pad 34. Source contact 46 is placed in electrical communication with leads 42-44 with wire bonds, which may be aluminum, gold, copper and the like. Gate contact 50 is in electrical communication with lead 41 with a wire bond.

First semiconductor die 128 is in superimposition with second semiconductor die 32 and bonded thereto using conductive adhesive (not shown) forming a die stack 155. First semiconductor die 128 is a MOSFET having gate, drain and source regions (not shown), each have a corresponding contact, defining a gate contact 156, a drain contact 158 and a source contact 160. Drain contact 158 is disposed upon a surface of first semiconductor die 128 that is disposed opposite to the surface upon which gate 156 and source 160 contacts are disposed. Drain contact 158 is positioned facing second semiconductor die 32 and in superimposition with source contact 46. Drain contact 158 is electrically isolated from source contact 46 by the presence of a passivation layer 129 positioned upon source contact 46. The passivation material employed for passivation layer 129 should be able to withstand the voltage difference between the drain of the first semiconductor die 128 and the source of second semiconductor die 32. To facilitate electrical communication between lead 36-38 and drain contact 158, the second semiconductor die 32 further comprises a layer 131 of conductive material, e.g. a floating metal layer, located over passivation layer 129.

Dimensions of layer 131 are established so that first semiconductor die 128 is in superimposition with a sub-portion of layer 131, with a remaining region 133 not in superimposition with first semiconductor die 128 having dimensions suitable to facilitate wire bonding thereto. Thus, layer 131 acts as both a die pad for the bottom electrode (e.g., drain contact 158) of first semiconductor die 128 and a bonding pad for conductive interconnections such as bonding wires to attach to for connection to the bottom electrode, while being insulated from the second semiconductor die 32. The bond wires are not shown in the cross section of FIG. 4 to avoid obscuring the details. Gate 50 and source 46 contacts may optionally also have a layer of conductive material on top of them (not shown) to bring the tops of the contact areas co-planar with the top of conductive layer 131 and to allow easier contact to the gate and source. Gate contact 156 is in electrical communication with lead 39 and source contact 160 is in electrical communication with die pad 34 in the manner discussed above in FIG. 3 with respect to gate contact 56 and source contact 60, respectively. The multi-die package 130 has the same advantages as the multi-die package 30 of FIG. 3 of larger die areas and lower Rdson. However the multi-die package 130 has the additional advantage of using standard vertical MOSFETs for the high side MOSFET 128 and low side 32 MOSFET, with source and gate on the top, and drain on the bottom.

Figure 6:
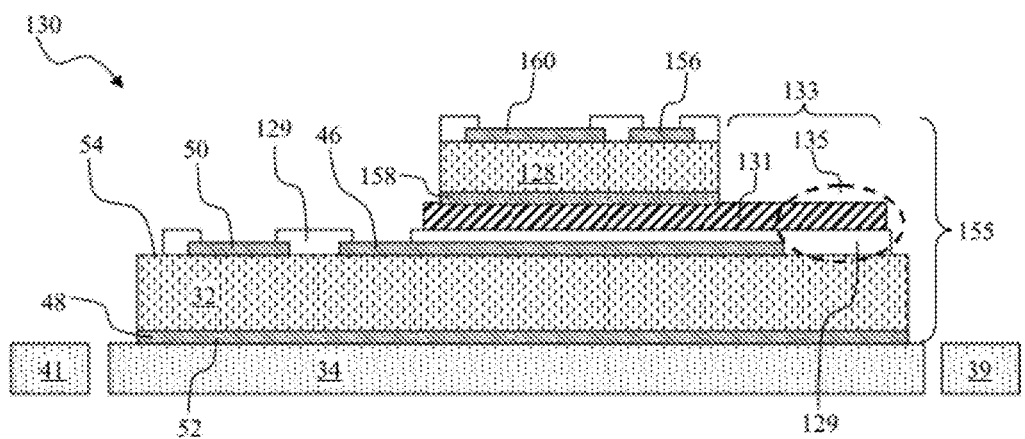
FIG. 6 is a cross-sectional view of the multi-chip package shown in FIG. 5, in accordance with an alternate embodiment.

Referring to FIG. 6, it was determined to be beneficial in certain instances to omit portions of source contact 46 in superimposition with a portion 135 of region 133 in which a wire bond would be placed. It was found that with certain metals used as source contact 46, the structural integrity of passivation layer 129 would become compromised and crack, causing shorts between layer 131 and source contact 46. If a metal making up source contact 46 is a soft material that is easily deformed, e.g., aluminum, the force of the wire bonding process on layer 131 directly above the source contact 46 could cause the passivation layer in between to crack. To reduce, if not avoid the aforementioned problem, the wire bonding to layer 131 takes place in a portion 135 of layer 131 which does not have source metal 46 directly under it. Setting aside a portion of the second semiconductor die 32 without the source metal 46 on it for wire bonding may sacrifice a small portion of the active area, but results in a more robust semiconductor package and higher manufacturing yields.

Figures 7, 8:
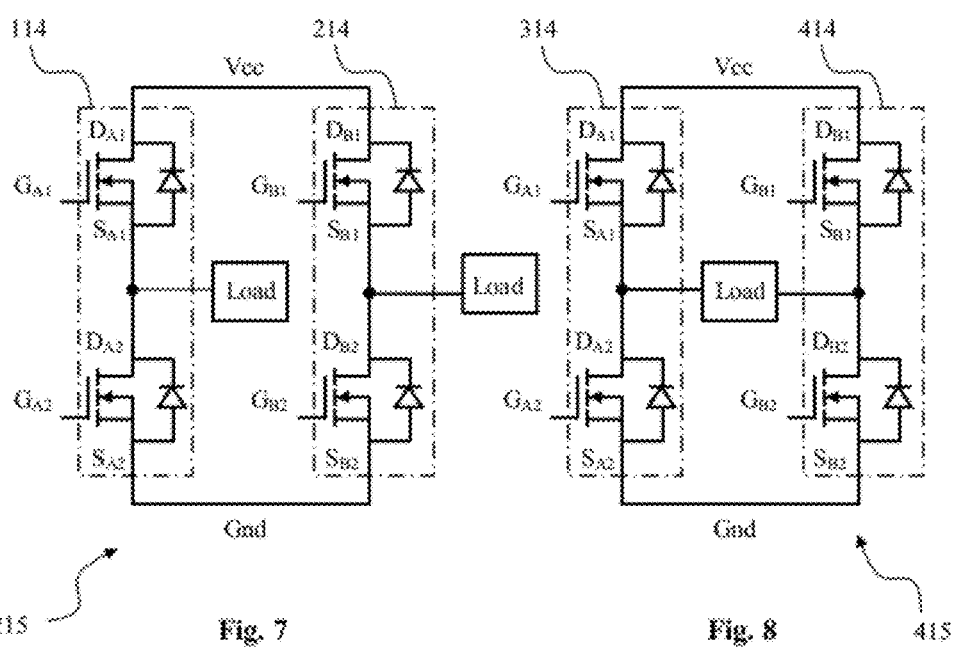
FIG. 7 is a schematic circuit diagram showing a circuit that may be formed using the present invention.
FIG. 8 is schematic circuit diagram of a full bridge circuit that may be formed using the present invention.
Figure 9:
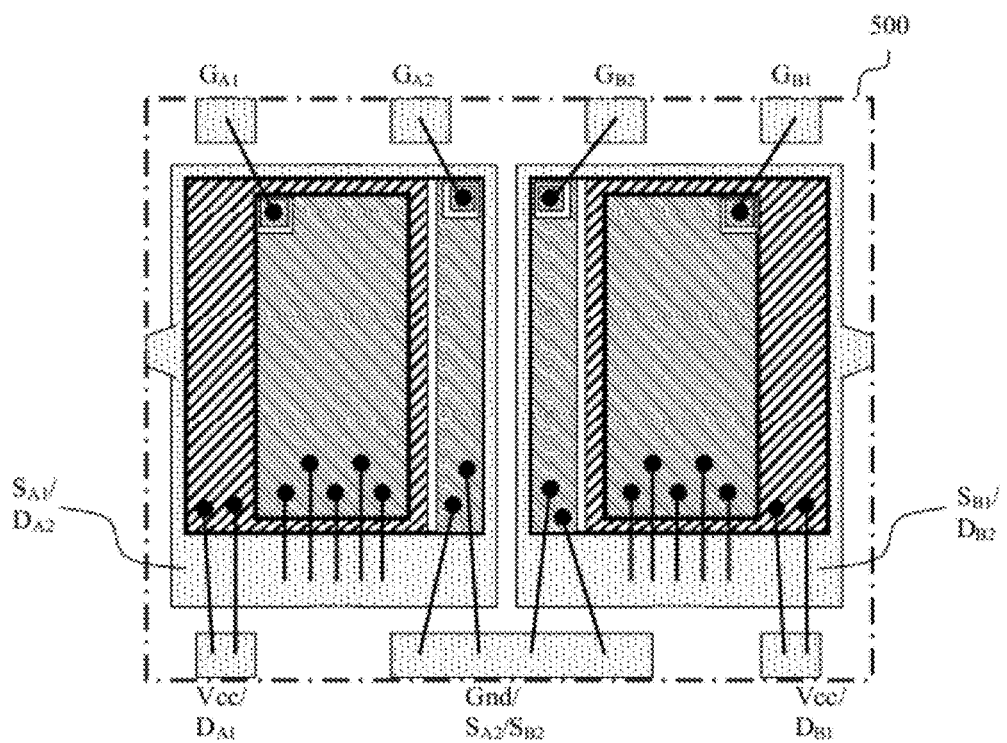
FIG. 9 is a top down plan view of a multi-chip package in accordance with another embodiment of the present invention that may be employed to form the circuits shown in FIGS. 7 and 8.

Referring to both FIG. 7, one application of the present invention may be employed to configure two pairs of MOSFETs 114 and 214 in parallel, as the circuit 215. However, pairs 314 and 414 of MOSFETs may be configured so that each is connected to a common load, shown in FIG. 8 as the full bridge circuit 415. Either circuit 215 or 415, shown in FIGS. 7 and 8, respectively, may be configured as package 500 using two of the die stacks disclosed in this application, as shown in FIG. 9. The leads Vcc/$D_{A1}$ and Vcc/$D_{B1}$ may be connected together externally from the package 500.

It should be understood that the foregoing description is merely an example of the invention and that modifications and may be made thereto without departing from the spirit and scope of the invention and should not be construed as limiting the scope of the invention. For example, thin wafers may be used for the high side and low side MOSFETs in order to keep the package thickness small. Therefore, the scope of the invention should be determined with respect to the appended claims, including the full scope of equivalents thereof.

The invention claimed is:

1. A die stack comprising: a bottom die; a top die stacked on the bottom die; and a floating metal layer disposed upon the bottom die, the floating metal layer being electrically isolated from the bottom die by insulating material, wherein the floating metal layer acts as an electrically conductive die pad for the top die and as a bond pad for conductive interconnections, and wherein both the bottom die and the top die are discrete semiconductor devices, and wherein the bottom die is a first MOSFET having a source on its top and a drain on its bottom, wherein the floating metal layer is isolated from said source of said first MOSFET by insulating material, and the top die is a second MOSFET having a source disposed upon one side and a drain disposed on a side opposite to said one side and contacting said floating metal layer.

2. The die stack of claim 1 wherein the bottom die is a first MOSFET having a source on its top and a drain on its bottom, wherein the floating metal layer is isolated from said source of said first MOSFET by insulating material, and the top die is a second MOSFET having a source disposed upon one side and a drain disposed on a side opposite to said one side and contacting said floating metal layer.

3. The die stack of claim 1 further comprising a lead frame die pad wherein the drain of the bottom die is attached to the lead frame die pad and the source of the top die is connected to said lead frame die pad by conductive interconnections.

4. The die stack of claim 3 further comprising lead frame leads; and a first set of conductive interconnections connected between a bond pad portion of said floating conductive layer and a first set of said lead frame leads.

5. The die stack of claim 4 wherein said bottom die is a low side MOSFET, and said top die is a high side MOSFET.

6. The die stack of claim 1 further comprising a top metal on top of the bottom die and underneath the insulating material and a portion of the floating metal, and a source metal is not under the bond pad portion of the floating metal layer.

7. A semiconductor package comprising: first and second die stacks, each of which includes a bottom die, a top die, and a floating metal layer disposed upon the bottom die, the floating metal layer being electrically isolated from the bottom die by insulating material, wherein the floating metal layer acts as a die pad for the top die and as a bond pad for conductive interconnections, and wherein said bottom die is a low side Power MOSFET and said top die is a high side Power MOSFET, and wherein the first and second dies stacks are connected in parallel.

8. The package of claim 7 wherein the first and second dies stacks are connected in parallel.

9. The package of claim 7 wherein the first and second die stacks form a full bridge circuit.

10. The package as recited in claim 7 wherein said second side includes first and second spaced-apart surfaces, with said first surface including a conductive metal layer disposed upon said second semiconductor die, with a drain contact of said first semiconductor die facing said first surface and contacting said conductive metal layer, with electrically non-conductive material extending between said second semiconductor die and said conductive metal layer and isolating said second semiconductor die from said conductive metal layer.

11. The package as recited in claim 7 wherein said second side includes first and second spaced-apart surfaces, with said first surface including a conductive metal layer disposed upon said second semiconductor die, with a drain contact of said first semiconductor die being in superimposition with and contacting a first portion of said conductive metal layer with a second portion of said conductive metal layer being in juxtaposition with said first portion, with electrically non-conductive material extending between said second semiconductor die and said conductive metal layer, wherein said second portion is a bonding pad for conductive interconnections.

12. The package as recited in claim 7 wherein said second semiconductor die has an area associated therewith that is greater than an area of said first semiconductor die.

13. A method of stacking two discrete dies, comprising:
providing a floating metal layer on the top of a bottom die, the floating metal layer being electrically isolated from the bottom die by insulating material; conductively attaching the bottom of a top die to the floating metal layer; and routing a connection from the bottom of the top die using the floating metal layer, and wherein the bottom die is a first MOSFET having a source on its top and a drain on its bottom, wherein the floating metal layer is isolated from said source of said first MOSFET by insulating material, and wherein the top die is a second MOSFET having its source contact on its top and a drain contact disposed on its bottom, said drain contact of said second MOSFET being attached to said floating metal layer.

14. The method of claim 13 wherein the discrete semiconductor devices are MOSFETs.

15. The method of claim 13 wherein the bottom die is a first MOSFET having a source on its top and a drain on its bottom, wherein the floating metal layer is isolated from said source of said first MOSFET by insulating material, and wherein the top die is a second MOSFET having its source contact on its top and a drain contact disposed on its bottom, said drain contact of said second MOSFET being attached to said floating metal layer.

16. The method of claim 15 wherein the bottom die is a low side MOSFET, and the top die is a high side MOSFET.

17. The method of claim 13 further comprising placing a source contact on top of the bottom die such that it is underneath the insulating material and a first portion of the floating metal layer, but not under a portion of the floating metal layer used for bonding conductive interconnections.

* * * * *